(12) United States Patent
Dutta et al.

(10) Patent No.: US 11,910,722 B2
(45) Date of Patent: Feb. 20, 2024

(54) SUBTRACTIVE TOP VIA AS A BOTTOM ELECTRODE CONTACT FOR AN EMBEDDED MEMORY

(71) Applicant: International Business Machines Corporation, Armonk, NY (US)

(72) Inventors: Ashim Dutta, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 165 days.

(21) Appl. No.: 17/542,696

(22) Filed: Dec. 6, 2021

(65) Prior Publication Data
US 2023/0180618 A1    Jun. 8, 2023

(51) Int. Cl.
| | |
|---|---|
| G11C 11/16 | (2006.01) |
| H10N 50/01 | (2023.01) |
| H10B 61/00 | (2023.01) |
| H10N 50/10 | (2023.01) |
| H10N 50/80 | (2023.01) |
| H10N 50/85 | (2023.01) |

(52) U.S. Cl.
CPC .......... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC ........ H10N 50/01; H10N 50/10; H10N 50/80; H10N 50/85; G11C 11/161; H10B 61/00
USPC .................................................. 365/158, 173
See application file for complete search history.

(56) References Cited

U.S. PATENT DOCUMENTS

| | | | |
|---|---|---|---|
| 6,783,999 B1 | 8/2004 | Lee | |
| 6,982,445 B2 | 1/2006 | Tsang | |
| 7,122,386 B1 | 10/2006 | Torng et al. | |
| 7,919,407 B1 * | 4/2011 | Zhong | H01L 21/76816 |
| | | | 438/618 |
| 8,969,982 B2 | 3/2015 | Xiao et al. | |
| 9,343,659 B1 | 5/2016 | Lu et al. | |

(Continued)

FOREIGN PATENT DOCUMENTS

| | | | | |
|---|---|---|---|---|
| CN | 114975512 A | * | 8/2022 | ......... H01L 27/2427 |
| DE | 102020101299 A1 | * | 7/2021 | ........... G11C 11/161 |

(Continued)

OTHER PUBLICATIONS

Mahalanabis, Debayan, Multilevel Resistance Programming in Conductive Bridge Resistive Memory, 2015, Arizona State University. All pages. (Year: 2015).*

(Continued)

*Primary Examiner* — Michael T Tran
(74) *Attorney, Agent, or Firm* — CANTOR COLBURN LLP; L. Jeffrey Kelly

(57) ABSTRACT

Embodiments of the invention include a subtractive top via as a bottom electrode contact for an embedded memory structure. Forming the bottom electrode contact includes depositing a conductive material on an underlayer and etching the conductive material to form an extended via and a conductive pad as an integral unit. The extended via extends from the conductive pad such that the extended via is adjacent to a memory structure, the extended via being formed as a first contact for the memory structure.

19 Claims, 16 Drawing Sheets

(56) References Cited

U.S. PATENT DOCUMENTS

| | | | |
|---|---|---|---|
| 9,763,329 B1* | 9/2017 | Mason | H05K 1/181 |
| 10,170,692 B2 | 1/2019 | Kar et al. | |
| 10,833,031 B2* | 11/2020 | Chen | H01L 24/20 |
| 11,653,582 B2* | 5/2023 | Arnaud | G11C 13/0069 |
| | | | 257/4 |
| 2005/0127519 A1* | 6/2005 | Scheuerlein | H01L 23/522 |
| | | | 257/773 |
| 2010/0084741 A1* | 4/2010 | Andres | B82Y 10/00 |
| | | | 257/536 |
| 2013/0119494 A1 | 5/2013 | Li et al. | |
| 2015/0115454 A1* | 4/2015 | Magnus | H01L 24/19 |
| | | | 257/773 |
| 2015/0364413 A1* | 12/2015 | Peng | H01L 23/5226 |
| | | | 438/666 |
| 2016/0365505 A1 | 12/2016 | Lu et al. | |
| 2017/0170062 A1* | 6/2017 | Murray | H01L 21/76879 |
| 2019/0027537 A1* | 1/2019 | Wiegand | H01L 23/53223 |
| 2020/0066580 A1* | 2/2020 | Peng | H01L 21/31056 |
| 2020/0264802 A1* | 8/2020 | Burke | G06F 3/0679 |
| 2020/0286875 A1* | 9/2020 | Nishida | H01L 25/50 |
| 2020/0335588 A1* | 10/2020 | Huang | H01L 21/76826 |
| 2021/0175166 A1* | 6/2021 | McGahay | H01L 21/7682 |
| 2021/0193584 A1* | 6/2021 | LiCausi | H01L 23/5226 |
| 2021/0210424 A1* | 7/2021 | Otsu | H10B 43/35 |
| 2021/0210503 A1* | 7/2021 | Matsuno | H01L 21/76877 |
| 2021/0305508 A1* | 9/2021 | Lee | H10N 70/8828 |
| 2022/0059580 A1* | 2/2022 | Chiang | H10N 70/8833 |
| 2022/0149102 A1* | 5/2022 | Nishioka | H01L 27/14636 |
| 2022/0157886 A1* | 5/2022 | Chuang | H01L 21/76816 |
| 2023/0140896 A1* | 5/2023 | Chuang | H10N 50/80 |
| | | | 257/421 |
| 2023/0189668 A1* | 6/2023 | Cheng | H10N 70/826 |
| | | | 365/163 |

FOREIGN PATENT DOCUMENTS

| | | | |
|---|---|---|---|
| JP | 04022093 A | * | 1/1992 |
| WO | 2018101956 A1 | | 6/2018 |

OTHER PUBLICATIONS

Ditizio, "Cell Shape and Patterning Considerations for Magnetic Random Access Memory (MRAM) Fabrication", Semiconductor Manufacturing Magazine, Jan. 2004, 7 pages.

* cited by examiner

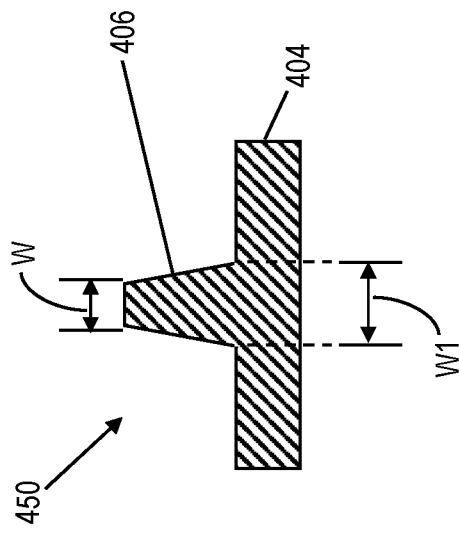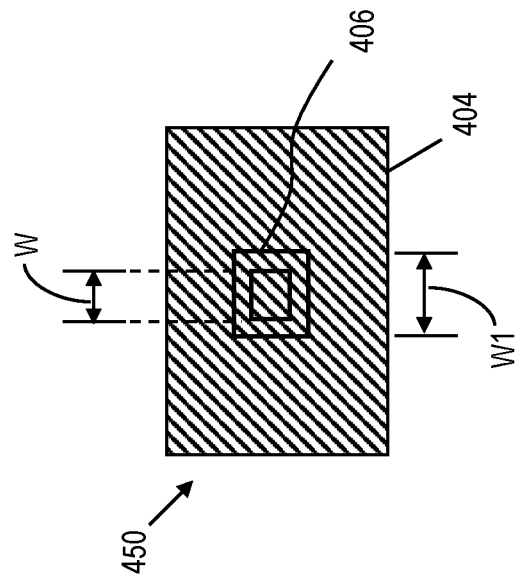

FIG. 14 1400

FORM AN INTEGRAL UNIT COMPRISING AN EXTENDED VIA AND A CONDUCTIVE PAD, THE INTEGRAL UNIT HAVING BEEN FORMED OF A SINGLE CONDUCTIVE MATERIAL SO AS TO HAVE NO SEAM BETWEEN THE EXTENDED VIA AND THE CONDUCTIVE PAD, THE EXTENDED VIA EXTENDING FROM THE CONDUCTIVE PAD  1402

FORM A MEMORY STRUCTURE ADJACENT TO THE EXTENDED VIA, A CONTACT BEING FORMED ADJACENT TO THE MEMORY STRUCTURE OPPOSITE THE EXTENDED VIA  1404

SUBTRACTIVE TOP VIA AS A BOTTOM ELECTRODE CONTACT FOR AN EMBEDDED MEMORY

BACKGROUND

The present invention generally relates to fabrication methods and resulting structures for integrated circuits, and more specifically, to fabrication methods and resulting structures configured and arranged to implement a subtractive top via as a bottom electrode contact for an embedded memory structure.

There are various types of memory structures. One type of memory structure is magnetoresistive random-access memory (MRAM) which uses a magnetic tunnel junction (MTJ) as the memory element. MRAM is a type of non-volatile random-access memory that stores data in magnetic domains. Tunnel magnetoresistance (TMR) is a magnetoresistive effect that occurs in the MTJ. The MTJ memory element includes two ferromagnets separated by a thin insulator. If the insulating layer is sufficiently thin (typically a few nanometers), electrons can tunnel from one ferromagnet into the other. Because this process is not allowed in classical physics, the tunnel magnetoresistance is a quantum mechanical phenomenon. MTJs are manufactured in thin film technology, and a top and bottom contact are respectively disposed on the top and bottom of the MTJ for read and write operations.

SUMMARY

Embodiments of the present invention are directed to a subtractive top via as a bottom electrode contact for an embedded memory structure. A non-limiting example method includes depositing a conductive material on an underlayer and etching the conductive material to form an extended via and a conductive pad as an integral unit. The extended via extends from the conductive pad such that the extended via is adjacent to a memory structure. The extended via is formed as a first contact for the memory structure.

Embodiments of the present invention are directed to a method that includes forming an integral unit including an extended via and a conductive pad. The integral unit has been formed of a single conductive material so as to have no seam between the extended via and the conductive pad. The extended via extends from the conductive pad. The method includes forming a memory structure adjacent to the extended via, where a contact is formed adjacent to the memory structure opposite the extended via Other embodiments of the present invention implement features of the above-described methods in structures/devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 6A depicts a cross-sectional view of a portion of an IC under-fabrication after fabrication operations according to one or more embodiments of the invention;

FIG. 6B depicts a top view of a portion of an IC under-fabrication in FIG. 6A after fabrication operations according to one or more embodiments of the invention;

FIG. 14 is a flowchart of a method for subtractive top via as a bottom electrode contact for an embedded memory structure according to one or more embodiments of the invention;

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The technology used in ICs continues to require improvement in speed and shrinkage of the chip area. Embedding magnetoresistive random-access memory (MRAM) pillars between back-end-of-line (BEOL) metal layers in 14 nanometer node technology and smaller requires aggressive shrinking of the MRAM device and the critical dimensional for the bottom electrode contact. BEOL processing is the second portion of IC fabrication where the individual devices, such as transistors, capacitors, resistors, etc., are interconnected with wiring on the wafer, which is referred to as the metallization layer. Conventional bottom electrode contacts are formed using the damascene process, and therefore, shrinking the critical dimension of the bottom electrode contact poses a risk of not having a void-free metal fill. Because of the reduction is dimensions, voids and/or seams are formed in the bottom electrode contact (e.g., copper bottom electrode contact) of the MRAM if the width/diameter (e.g., critical dimension) of the bottom electrode contact is reduced.

One or more embodiments of the present invention provide methods and resulting structures configured and arranged to implement a subtractive top via as a bottom electrode contact for an embedded memory structure. In one or more embodiments, bottom electrode contacts for MRAM pillars are formed using a subtractive process, and there is no limitation to the critical dimension shrinkage of the bottom electrode contact. The top of the bottom electrode contact is smaller than the critical dimension of the bottom layer/portion of the MRAM. In one or more embodiments of the invention, bottom electrode contacts and the metal lines underneath are formed from the same deposited metal.

To form the bottom electrode contact according to one or more embodiments of the invention, a thick metal layer is deposited on a substrate to form lower-level metal lines. In particular, metal lines and pads are formed in the memory array and logic area along with bottom electrode contacts using a subtractive etch. Memory stacks are deposited and then patterned using reactive ion etching (RIE) and/or ion beam etching (IBE). The memory stacks are then encapsulated, and top contact metal lines are formed in the memory array area along with metal lines and vias in the logic area.

Figure 1:
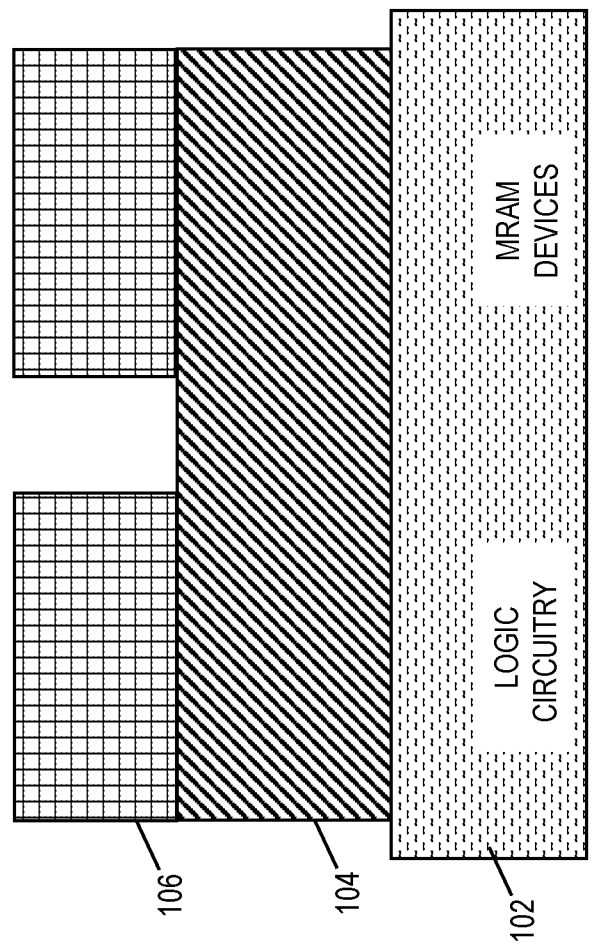
FIG. 1 depicts a cross-sectional view of a portion of an IC under-fabrication after fabrication operations according to one or more embodiments of the invention.

Turning now to a more detailed description of aspects of the present invention, FIG. 1 depicts a cross-sectional view of a portion of the IC 100 which uses subtractive etching to form a top via as a bottom electrode contact for an embedded memory structure after fabrication operations according to one or more embodiments of the invention. Standard semiconductor fabrication techniques can be utilized to fabricate IC 100 as understood by one of ordinary skill in the art. Moreover, any suitable deposition techniques and etching techniques can be utilized herein.

FIG. 1 illustrates a blanket metal layer 104 deposited on an underlayer 102. Underlayer 102 can be an interlayer dielectric (ILD). Although not shown for conciseness, underlayer 102 can contain logic circuitry and an array of memory devices (e.g., MRAM) device. Example materials of underlayer 102 (as well as ILD materials 702, 1004 discussed in FIGS. 7 and 10, respectively) can include a low-k dielectric material, ultra-low-k dielectric material, tetraethyl orthosilicate or tetraethoxysilane (TEOS), etc. The ultra-low-k material includes dielectric materials having a k value less than 2.5, where k values are measured relative to a vacuum. Example ultra-low-k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. Ultra-low-k dielectric materials may be produced using a templated process or a sol-gel process as is generally known in the art. Low-k dielectric materials may include materials having a k value greater than 2.5. Example low-k materials may include silicon dioxide, organosilicate glass (OSG), carbon-doped oxide, etc.

Metal layer 104 can include noble metals such as rhenium, ruthenium, rhodium, palladium, silver, osmium, iridium, platinum, and gold. Metal layer 104 can also include other metals like W, Ti, TiN, Ta, TaN and Co. Metal layer 104 excludes copper and/or any material that requires a diffusion barrier/liner. Metal layer 104 is an etchable conductive material that can be etched using, for example, RIE and/or IBE.

A lithography mask 106 is deposited and patterned on top of metal layer 104. Lithography mask 106 can be a multi-layer stack. As a tri-layer stack, lithography mask 106 may include a silicon containing anti-reflective coating (SiARC) layer formed on an organic planarization layer (OPL), and a photoresist layer formed on top of the SiARC layer, thereby resulting in a photoresist/SiARC/OPL stack. As a quad-layer stack, lithography mask 106 may include a silicon oxynitride (SiON) layer formed on an OPL or $SiO_2$ layer, a bottom antireflective coating (BARC) layer formed on the SiON layer, and a photoresist layer formed on top of the BARC layer, thereby resulting in a photoresist/BARC/SiON/($SiO_2$ or OPL) stack.

Figure 2:
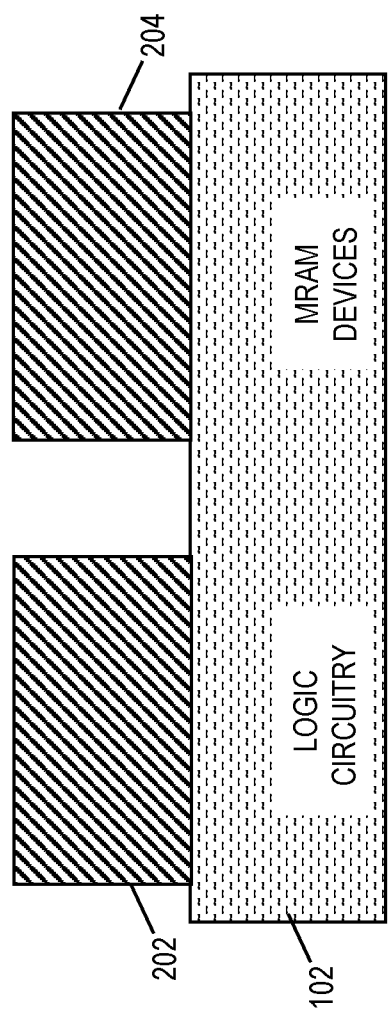
FIG. 2 depicts a cross-sectional view of a portion of an IC under-fabrication after fabrication operations according to one or more embodiments of the invention.

FIG. 2 depicts a cross-sectional view of a portion of the IC 100 after fabrication operations according to one or more embodiments of the invention. FIG. 2 illustrates performing a metal etch to form metal lines from conductive material (e.g., metal layer 104) as depicted in FIG. 1. For example, separate metal lines 202 and 204 have been formed. Lithography mask 106 is removed, for example, by ashing (e.g., plasma ashing).

Figure 3:
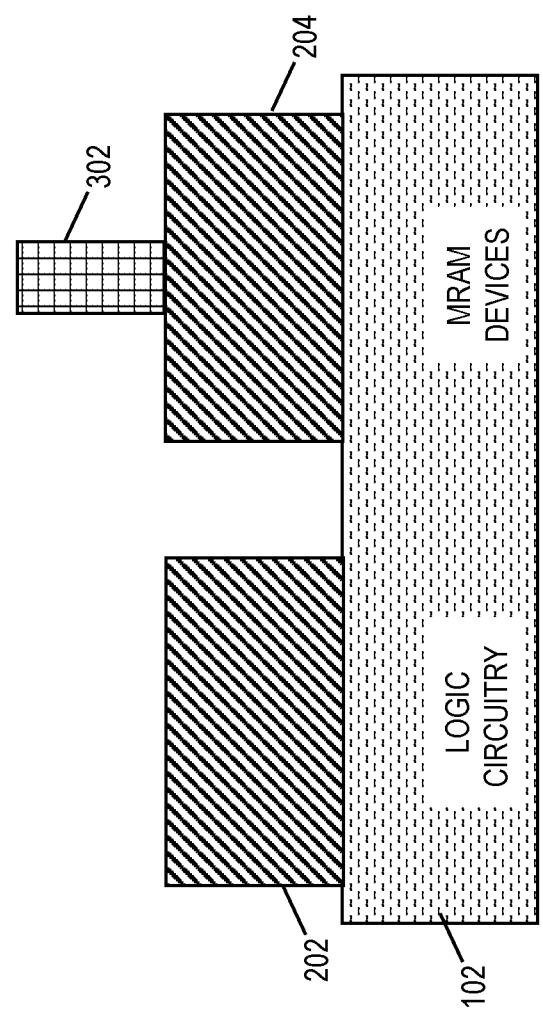
FIG. 3 depicts a cross-sectional view of a portion of an IC under-fabrication after fabrication operations according to one or more embodiments of the invention.

FIG. 3 depicts a cross-sectional view of a portion of the IC 100 after fabrication operations according to one or more embodiments of the invention. A lithography mask 302 is deposited and patterned on top of metal line 204 but not on metal line 202. Lithography mask 302 may include materials discussed for lithography mask 106. The width of the lithography mask 302 may range from about 10 nanometers (nm) to 100 nm.

Figure 4:
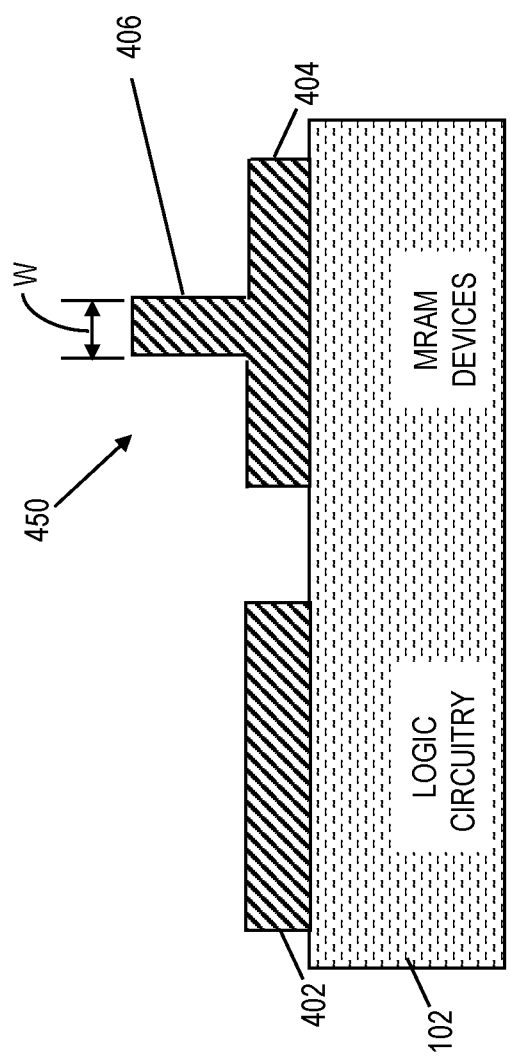
FIG. 4 depicts a cross-sectional view of a portion of an IC under-fabrication after fabrication operations according to one or more embodiments of the invention.

FIG. 4 depicts a cross-sectional view of a portion of the IC 100 after fabrication operations according to one or more embodiments of the invention. Exposed portions of metal lines 202, 204 are recessed. An anisotropic etch is used. In one or more embodiments, etching such as RIE and/or IBE may be utilized. The etching results in recessed metal line 402 which has been reduced to a shorter height than metal line 202 (depicted in FIG. 3). According to the patterned lithography mask 302, the etching results in an integral unit 450 including a metal pad 404 with an extended via 406, all of which is concurrently formed from the single metal line 204 (depicted in FIG. 3). As such, extended via 406 is the top via that extends from metal pad 404 with no interface or liner or barrier layer between extended via 406 and metal pad 404, because they both are formed of the same block of conductive material. Standard etch optimizations known by one of ordinary skill in the art can be used to control sidewall angle of the extended via 406. Since formation of extended via 406 does not require metal fill the metal contact can be void free. Lithography mask 302 is removed, for example, by ashing (e.g., plasma ashing).

The topmost portion of extended via 406 can have a width (and/or diameter) W. The width W can be less than 15 nm. The width W can be less than 10 nm. The width W can be 9, 8, 7, 6, 5 nm, etc. The width W can range from 10-50 nm. The extended via 406 will be the bottom electrode contact for a memory structure, as discussed further herein. It is noted that a bottom electrode contact formed using a damascene processed has a critical dimension shrinkage limitation because of metal fill challenges resulting in seams and voids in the fill metal (particularly copper) in the state-of-the-art; therefore, conventional techniques for bottom electrode contacts would not have a width/diameter of that reaches as low as 15 nm without metal fill issues. However, using the subtractive process for the bottom electrode contact in which integral unit 450 is formed on the same conductive block of metal as discussed herein according to one or more embodiments of the invention, there is no limitation to the critical dimension shrinkage of bottom electrode contact. Particularly, extended via 406 has no voids even at the small width W, and there are no seams/voids at and/or near the combination of extended via 406 and metal pad 404 because they are simultaneously etched from a single monolithic block of conductive material.

Figure 5:
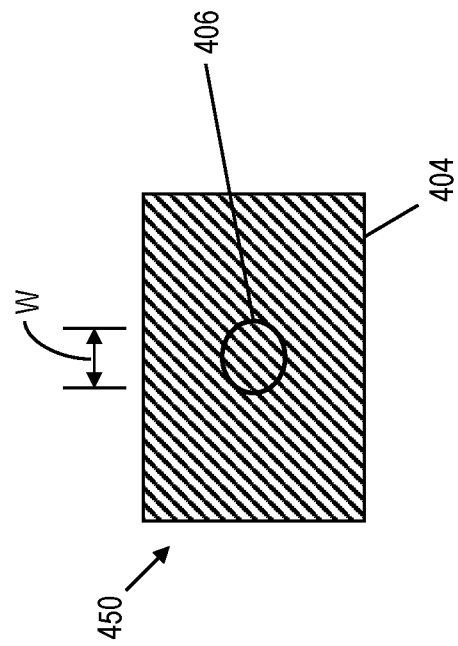
FIG. 5 depicts a top view of a portion of an IC under-fabrication after fabrication operations according to one or more embodiments of the invention.

FIG. 5 depicts a top view of integral unit 450 of the IC 100 after fabrication operations according to one or more embodiments of the invention. FIG. 5 illustrates metal pad 404 with extended via 406. In this example, extended via 406 is a metal pillar/column with a circular diameter. It should be appreciated that FIG. 5 highlights integral unit 450 and other portions of the IC have been omitted.

FIG. 6A depicts a cross-sectional view of integral unit 450 of the IC 100 after fabrication operations according to one or more embodiments of the invention. FIG. 6B depicts a top view of integral unit 450 of the IC 100 in FIG. 6A after fabrication operations according to one or more embodiments of the invention. In FIGS. 6A, 6B extended via 406 has a trapezoidal shape in which the topmost portion is smaller than the base. In this example, the topmost portion has the width W (as discussed herein), while the bottommost portion (or base) has the width W1. The width W1 is greater than the width W of extended via 406, as seen in FIGS. 6A, 6B. Any fabrication operations discussed for integral unit 450 in FIG. 5 also apply by analogy to FIGS. 6A, 6B. It should be appreciated that FIGS. 6A, 6B highlight integral unit 450 and other portions of the IC have been omitted.

Figure 7:
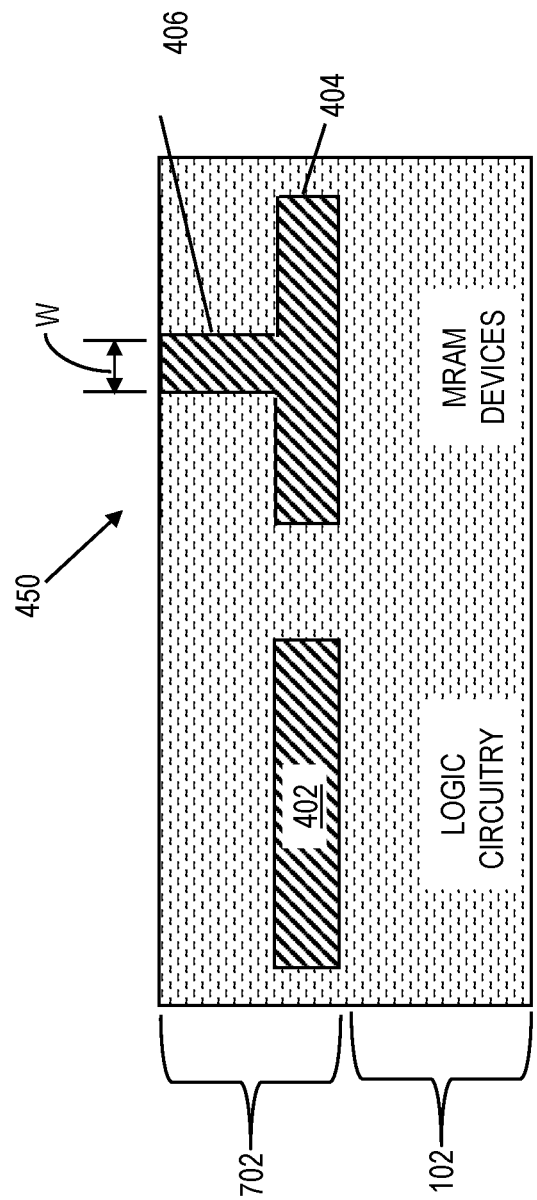
FIG. 7 depicts a cross-sectional view of a portion of an IC under-fabrication after fabrication operations according to one or more embodiments of the invention.

FIG. 7 depicts a cross-sectional view of a portion of the IC 100 after fabrication operations according to one or more embodiments of the invention. Additional ILD material 702 is deposited and recessed. For example, chemical mechanical polishing/planarization (CMP) may be performed to expose the top surface of extended via 406. ILD material 702 may include the materials discussed for underlayer 102.

Figure 8:
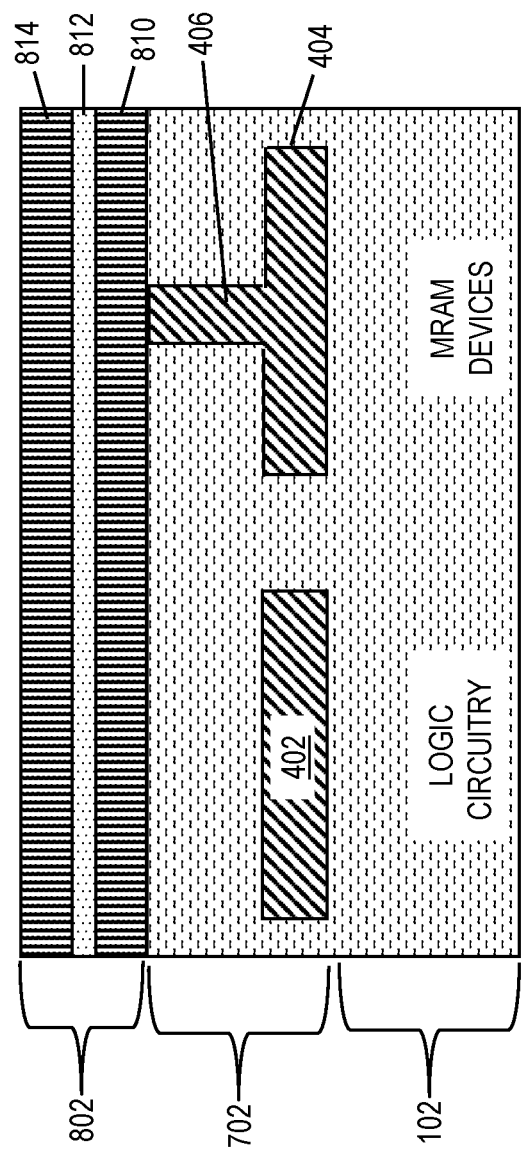
FIG. 8 depicts a cross-sectional view of a portion of an IC under-fabrication after fabrication operations according to one or more embodiments of the invention.

FIG. 8 depicts a cross-sectional view of a portion of the IC 100 after fabrication operations according to one or more embodiments of the invention. FIG. 8 illustrates deposition of memory stack 802. Memory stack 802 may be for a magnetic tunnel junction (MTJ) device used as MRAM. In one or more embodiments, memory stack 802 may include a bottom electrode 810, top electrode 814, and MRAM memory stack 812 which includes magnetic layer, tunnel barrier layer, and another magnetic layer such that the tunnel barrier layer is sandwiched between the two magnetic layers. One of the magnetic layers is a free magnetic layer, while the other magnetic layer is a reference magnetic layer also referred to as a fixed layer. Each of magnetic layers, and tunnel barrier layer in MRAM memory stack 812 may include one or more layers and include any standard materials known in the art for MRAMs. The tunnel barrier layer is a thin insulator material, such as an oxide. Magnetic layers can include a ferromagnetic material.

Figure 9:
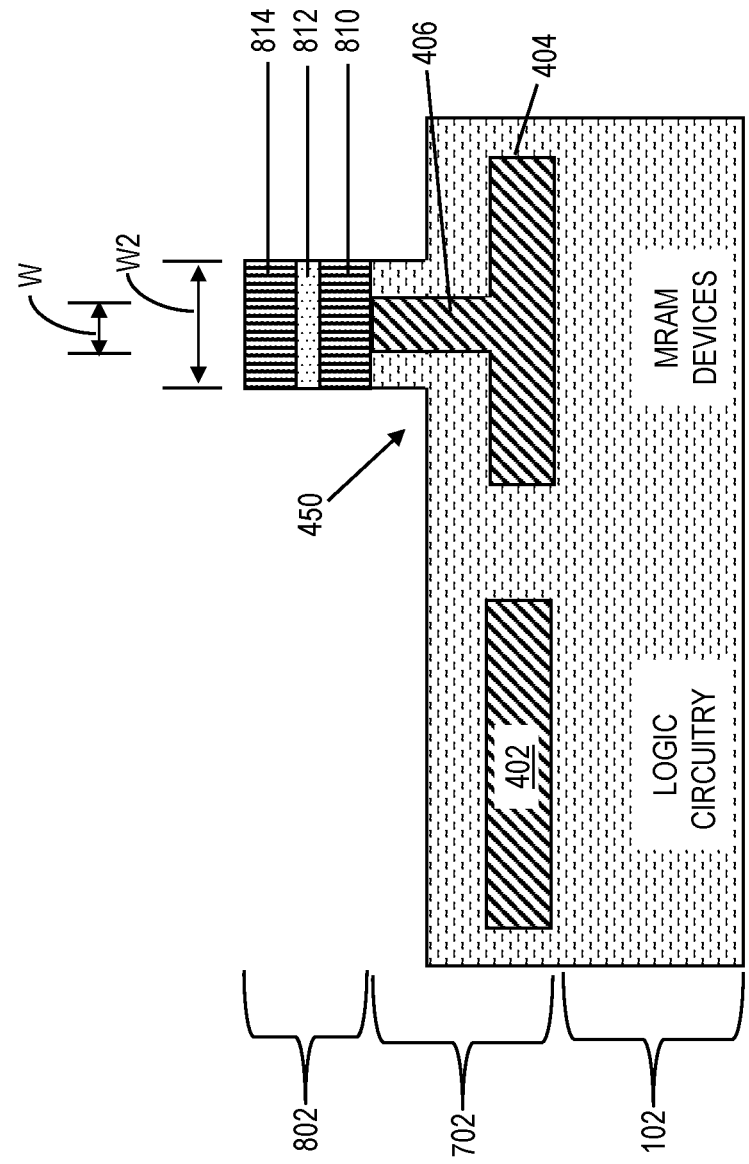
FIG. 9 depicts a cross-sectional view of a portion of an IC under-fabrication after fabrication operations according to one or more embodiments of the invention.

FIG. 9 depicts a cross-sectional view of a portion of the IC 100 after fabrication operations according to one or more embodiments of the invention. FIG. 9 illustrates a memory stack etch, resulting in memory stack 802 with the width/diameter W2. As seen in FIG. 9, a portion of the ILD material 702 has been recessed except for portion directly under memory stack 802. For example, a hardmask layer or lithography mask (not shown) can be deposited and patterned in order to etch memory stack 802. The lithography mask is removed, for example, by ashing (e.g., plasma ashing). Memory stack 802 has the width/diameter W2 which is greater than the width/diameter W (topmost portion) of extended via 406. A narrowed portion of ILD material 702 and the width/diameter W of extended via 406 combined to form the width/diameter W2.

Figure 10:
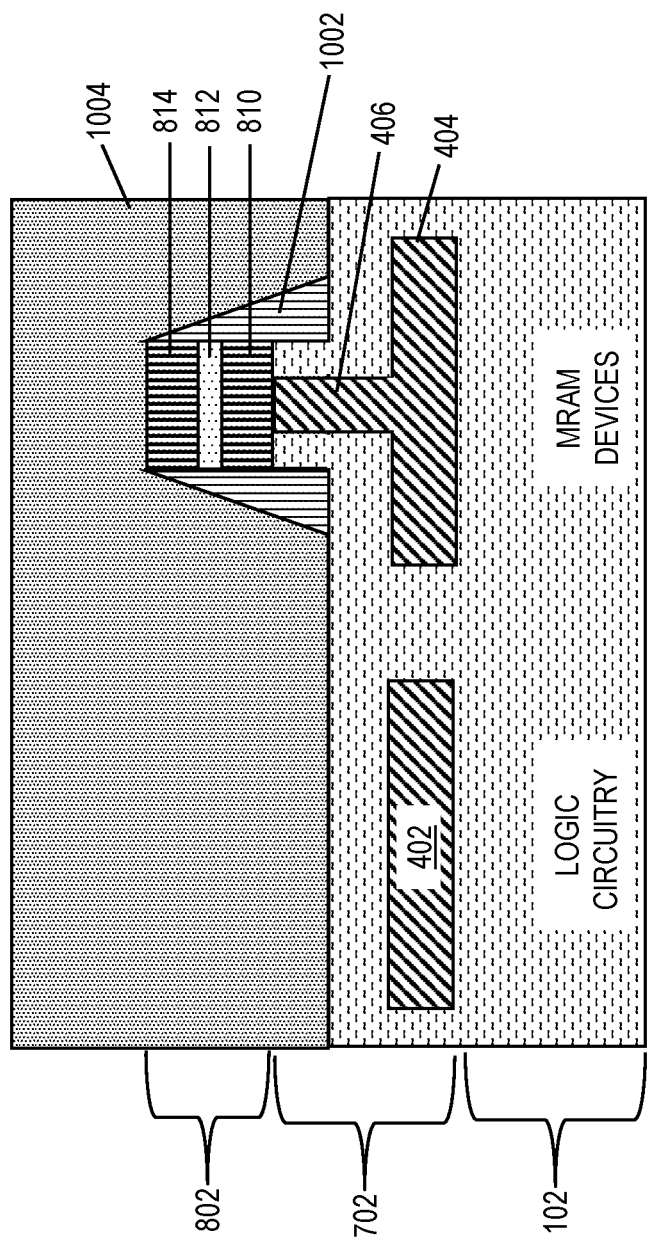
FIG. 10 depicts a cross-sectional view of a portion of an IC under-fabrication after fabrication operations according to one or more embodiments of the invention.

FIG. 10 depicts a cross-sectional view of a portion of the IC 100 after fabrication operations according to one or more embodiments of the invention. FIG. 10 illustrates deposition of encapsulation material which is deposited and etched to form encapsulation layer 1002 around the sides of memory stack 802 and a portion of ILD material 702. Example materials of encapsulation layer 1002 may include $SiO_2$, SiC, SiN, etc. Encapsulation layer 1002 is recessed (e.g., CMP) to expose a top surface of memory stack 802. Another ILD material 1004 is deposited on top of memory stack 802, encapsulation layer 1002, and ILD material 702. ILD material 1004 may include the materials discussed for ILD material 702 and underlayer 102.

Figure 11:
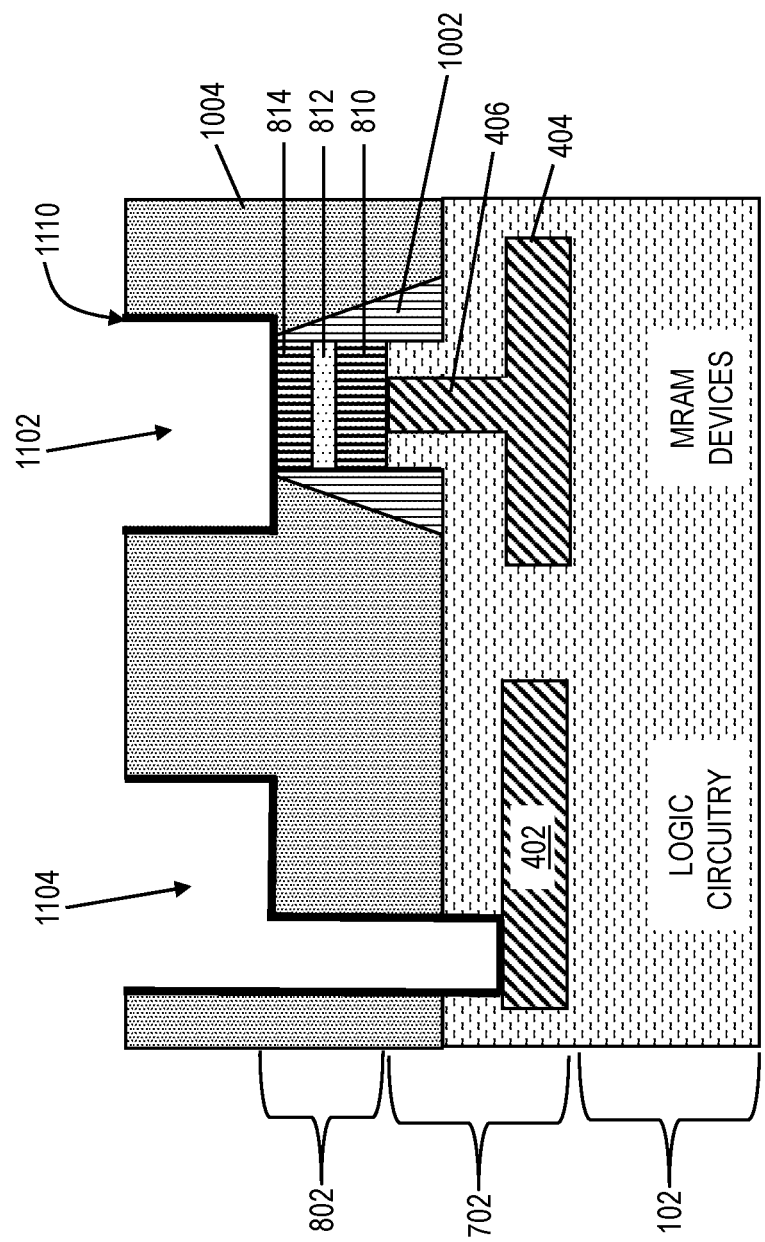
FIG. 11 depicts a cross-sectional view of a portion of an IC under-fabrication after fabrication operations according to one or more embodiments of the invention.

FIG. 11 depicts a cross-sectional view of a portion of the IC 100 after fabrication operations according to one or more embodiments of the invention. Using a hardmask layer (not shown), etching is performed to form a cavity 1104 exposing the top surface of memory stack 802 and to form a cavity 1104 exposing a top surface of metal line 402. Cavity 1104 may include a narrower elongated portion as an empty via. A liner 1110 is deposited to line/coating cavities 1102, 1104 in order to act as a diffusion barrier against diffusion of the filling metal. An example material of liner 1110 may include TiN, TaC, TaN, HfN, Ru, etc., and combinations of the same.

Figure 12:
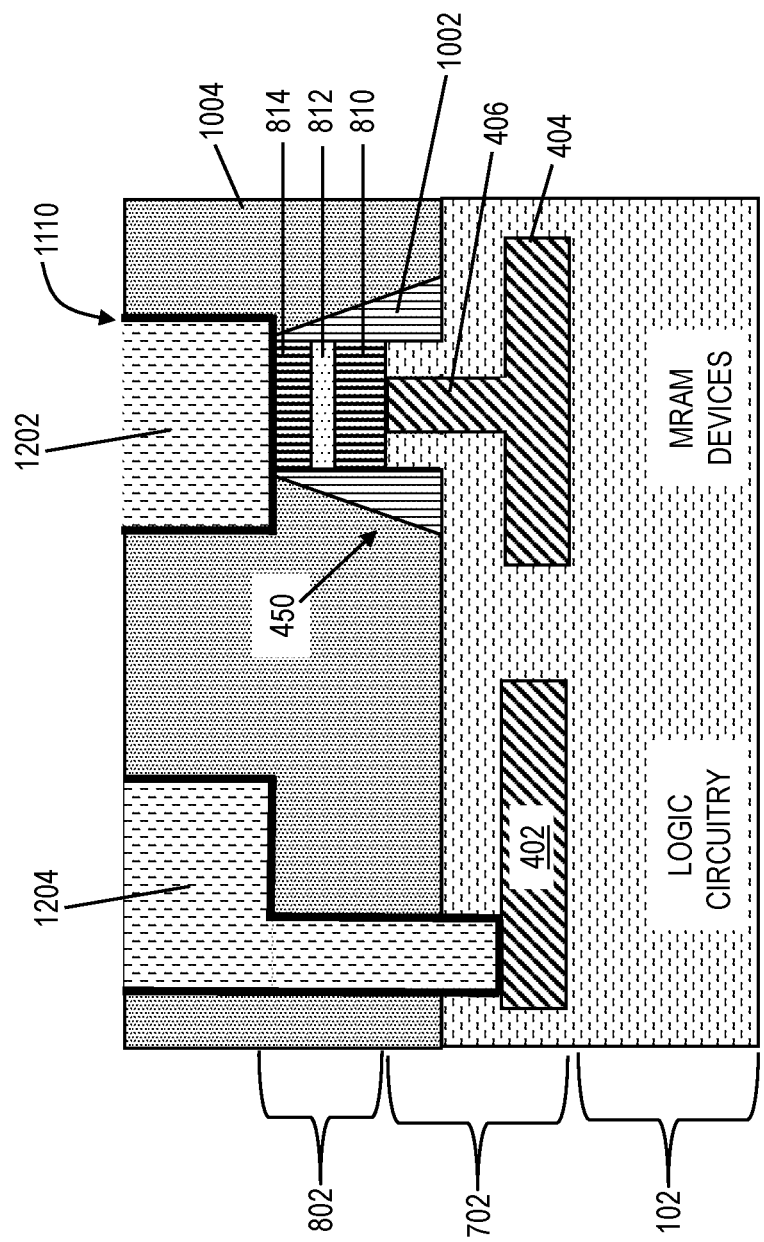
FIG. 12 depicts a cross-sectional view of a portion of an IC under-fabrication after fabrication operations according to one or more embodiments of the invention.

FIG. 12 depicts a cross-sectional view of a portion of the IC 100 after fabrication operations according to one or more embodiments of the invention. FIG. 12 illustrates top contact formation. Contact material is deposited in cavities 1102, 1104 to form top contacts 1202, 1204 respectively. As seen in FIG. 12, top contact 1202 is directly above memory stack 802. Example materials for top contacts 1202, 1204 may include Cu, W, C, Ru, Al, etc.

Figure 13:
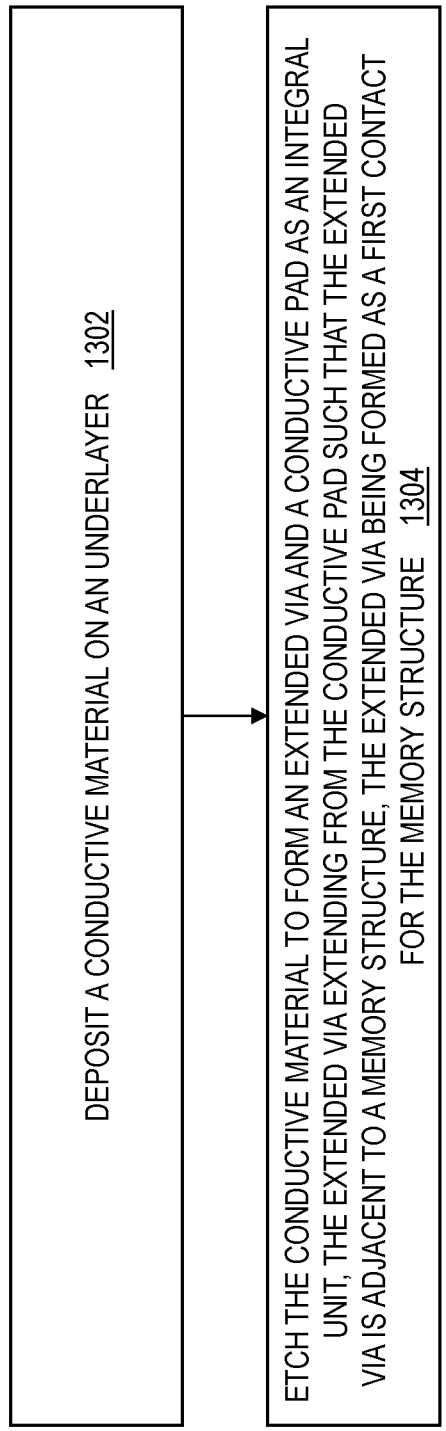
FIG. 13 is a flowchart of a method for subtractive top via as a bottom electrode contact for an embedded memory structure according to one or more embodiments of the invention.

FIG. 13 is a flowchart of a method 1300 for subtractive top via as a bottom electrode contact for an embedded memory structure according to one or more embodiments of the invention. Reference can made where appropriate to FIGS. 1-12. At block 1302, the method 1300 includes depositing a conductive material (e.g., blanket metal layer 104) on an underlayer (e.g., underlayer 102). At block 1304, the method 1300 includes etching the conductive material to form an extended via (e.g., extended via 406) and a conductive pad (e.g., metal pad 404) as an integral unit 450, the extended via (e.g., extended via 406) extending from the conductive pad (e.g., metal pad 404) such that the extended via is adjacent to a memory structure (e.g., memory stack 802), the extended via being formed as a first contact (e.g., bottom electrode contact) for the memory structure (e.g., memory stack 802).

A lithography mask 106 is used as a pattern to etch the conductive material into the extended via and the conductive pad (e.g., extended via 406 and metal pad 404). An interlayer dielectric material (e.g., ILD material 702) is formed on the extended via and the conductive pad, such that the memory structure (e.g., memory stack 802) is positioned on the extended via and a portion of the interlayer dielectric material (e.g., narrow portion of ILD material 702 depicted in FIG. 9).

A width of the extended via is smaller than a width of the memory structure (e.g., width W of the topmost portion of extended via 406 is smaller than the width W2 of memory stack 802). The memory structure comprises a stack 812 of memory layers (e.g., two magnetic layers and tunnel barrier layer) sandwiched between bottom electrode 810 and top electrode 814 configured to store data, the stack of the memory layers having been patterned to be positioned adjacent to the extended via. The conductive material is patterned into a plurality of portions (e.g., metal lines 202, 204) in preparation for the etching the conductive material to form the extended via and the conductive pad (e.g., extended via 406 and metal pad 404) from one of the plurality of portions. The (simultaneous) etching forms another one of the plurality of portions into a metal line (e.g., metal line 202). An encapsulation material is formed on sides of the memory structure (e.g., encapsulation layer 1002 is formed on memory stack 802) and a second contact (e.g., top contact 1202) is formed on the memory structure. Anisotropic etching (e.g., RIE, IBE, etc.) is used to from the extended via and the conductive pad as the integral unit (e.g., extended via 406 and metal pad 404 as integral unit 450). The conductive material comprises a noble metal. The conductive material excludes copper. A periphery of the integral unit 450 excludes a liner material (e.g., excludes liner materials suitable for copper).

FIG. 14 is a flowchart of a method 1400 for subtractive top via as a bottom electrode contact for an embedded memory structure according to one or more embodiments of the invention. Reference can made where appropriate to FIGS. 1-12.

At block 1402, the method 1400 includes forming an integral unit 450 comprising an extended via 406 and a conductive pad (e.g., metal pad 404), the integral unit having been formed of a single conductive material (e.g., metal line 204 of blanket metal layer 104) so as to have no seams between the extended via 406 and the conductive pad (e.g., metal pad 404), the extended via extending (vertically) from the conductive pad. At block 1404, the method 1400 includes forming a memory structure (e.g., memory stack 802) adjacent to the extended via 406, a contact (e.g., top contact 1202) being formed adjacent to the memory structure opposite the extended via.

A width W of the extended via is smaller than a width W2 of the memory structure. A periphery of the integral unit 450 excludes a liner material, and a memory structure, the extended via 406 being formed as a bottom contact for the memory structure.

Figure 15:
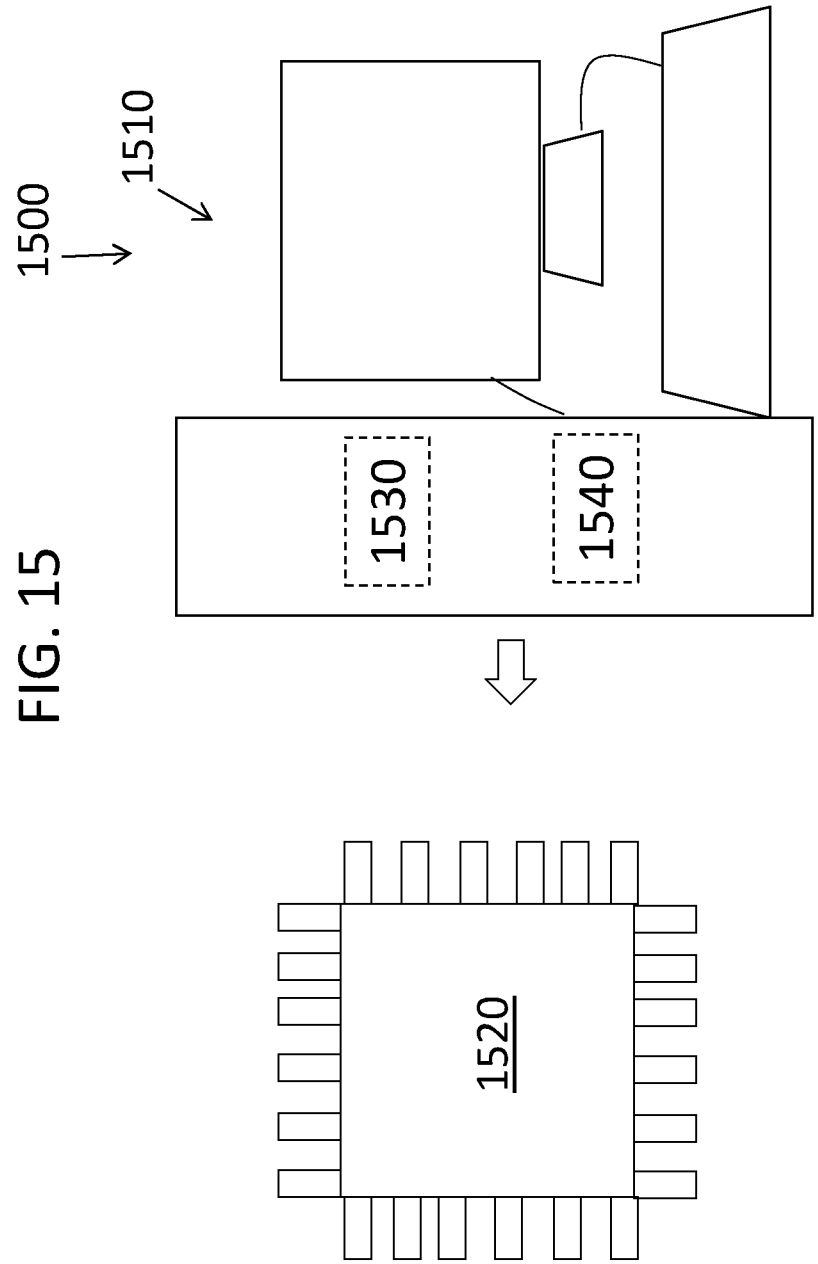
FIG. 15 is a block diagram of a system to design/layout a portion of an IC that uses reflow techniques for boundary control in accordance with one or more embodiments of the present invention.

FIG. 15 is a block diagram of a system 1500 according to embodiments of the invention. The system 1500 includes processing circuitry 1510 used to generate the design 1530 that is ultimately fabricated into an integrated circuit 1520, which can include a variety of active semiconductor devices. The steps involved in the fabrication of the integrated circuit 1520 are well-known and briefly described herein. Once the physical layout 1540 is finalized, based, in part, on IC 100 using a subtractive top via as a bottom electrode contact for an embedded memory structure according to embodiments of the invention, the finalized physical layout 1540 is provided to a foundry. Masks are generated for each layer of the integrated circuit based on the finalized physical layout. Then, the wafer is processed in the sequence of the mask order. The processing includes photolithography and etch. This is further discussed with reference to FIG. 16.

Figure 16:
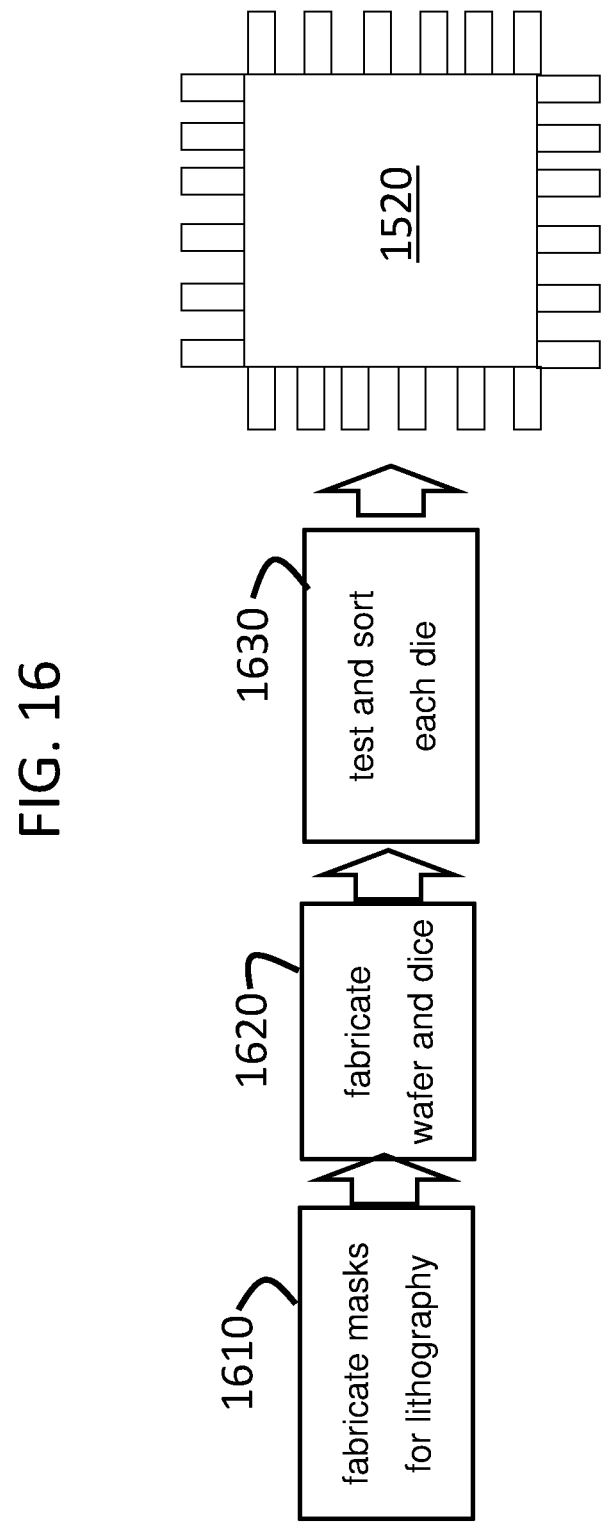
FIG. 16 is a process flow of a method of fabricating the IC of FIG. 15 in accordance with one or more embodiments of the present invention.

FIG. 16 is a process flow of a method of fabricating the integrated circuit according to exemplary embodiments of the invention. Once the physical design data is obtained, based, in part, IC 100, the integrated circuit 1520 can be fabricated according to known processes that are generally described with reference to FIG. 16. Generally, a wafer with multiple copies of the final design is fabricated and cut (i.e., diced) such that each die is one copy of the integrated circuit 1520. At block 1610, the processes include fabricating masks for lithography based on the finalized physical layout. At block 1620, fabricating the wafer includes using the masks to perform photolithography and etching. Once the wafer is diced, testing and sorting each die is performed, at block 1630, to filter out any faulty die.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a" "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
depositing a conductive material on an underlayer; and
etching the conductive material to form both an extended via elongated in a first dimension and a conductive pad elongated in a second dimension perpendicular to the first dimension as an integral unit, the extended via extending from the conductive pad such that the extended via is adjacent to a memory structure, the extended via being formed as a first contact for the memory structure, wherein the conductive material is patterned into a plurality of portions in preparation for the etching of the conductive material to form the extended via and the conductive pad from one of the plurality of portions.

2. The method of claim 1, wherein a lithography mask is used as a pattern to etch the conductive material into the extended via and the conductive pad.

3. The method of claim 1, wherein an interlayer dielectric material is formed on the extended via and the conductive pad, such that the memory structure is positioned on the extended via and a portion of the interlayer dielectric material.

4. The method of claim 1, wherein a width of a top portion of the extended via is smaller than a width of a bottom portion of the extended via and a width of the memory structure.

5. The method of claim 1, wherein the memory structure comprises a stack of memory layers configured to store data, the stack of memory layers having been patterned to be positioned adjacent to the extended via.

6. The method of claim 1, wherein the etching forms another one of the plurality of portions into a metal line.

7. The method of claim 1, wherein an encapsulation material is formed on sides of the memory structure and a second contact is formed on the memory structure.

8. The method of claim 1, wherein anisotropic etching is used to from the extended via and the conductive pad as the integral unit.

9. The method of claim 1, wherein the conductive material comprises a noble metal.

10. The method of claim 1, wherein the conductive material excludes copper.

11. The method of claim 1, wherein a periphery of the integral unit excludes a liner material.

12. A structure comprising:
an integral unit comprising an extended via and a conductive pad, the integral unit having been formed of a single conductive material so as to have no seam between the extended via and the conductive pad, the extended via extending from the conductive pad; and
a memory structure adjacent to the extended via, a contact being formed adjacent to the memory structure opposite the extended via.

13. The structure of claim 12, wherein an interlayer dielectric material is formed on the extended via and the conductive pad, such that the memory structure is positioned on the extended via and a portion of the interlayer dielectric material.

14. The structure of claim 12, wherein a width of a top portion of the extended via is smaller than a width of a bottom portion of the extended via and a width of the memory structure.

15. The structure of claim 12, wherein the memory structure comprises a stack of memory layers configured to store data.

16. The structure of claim 12, wherein an encapsulation material is formed on sides of the memory structure and a second contact is formed on the memory structure.

17. The structure of claim 12, wherein a periphery of the integral unit excludes a liner material.

18. A method of forming a structure, the method comprising:
forming an integral unit comprising an extended via and a conductive pad, the integral unit having been formed of a single conductive material so as to have no seam between the extended via and the conductive pad, the extended via extending from the conductive pad; and
forming a memory structure adjacent to the extended via, a contact being formed adjacent to the memory structure opposite the extended via.

19. The method of claim 18, wherein:
a width of a top portion of the extended via is smaller than a width of a bottom portion of the extended via and a width of the memory structure;
a periphery of the integral unit excludes a liner material; and
the extended via being formed as a bottom contact for the memory structure.

* * * * *